(12) United States Patent
Khechana et al.

(10) Patent No.: US 9,405,116 B2
(45) Date of Patent: Aug. 2, 2016

(54) MEMS MICRO-MIRROR ASSEMBLY

(71) Applicant: Intel Corporation, Santa Clara, CA (US)

(72) Inventors: Faouzi Khechana, Preverenges (CH); Nicolas Abele, Demoret (CH)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/382,724

(22) PCT Filed: Feb. 11, 2013

(86) PCT No.: PCT/EP2013/052682
§ 371 (c)(1),
(2) Date: Sep. 3, 2014

(87) PCT Pub. No.: WO2013/131719
PCT Pub. Date: Sep. 12, 2013

(65) Prior Publication Data
US 2015/0009549 A1    Jan. 8, 2015

Related U.S. Application Data

(60) Provisional application No. 61/608,434, filed on Mar. 8, 2012.

(51) Int. Cl.
*G02B 26/08* (2006.01)
*B81C 3/00* (2006.01)
(Continued)

(52) U.S. Cl.
CPC .......... *G02B 26/085* (2013.01); *B81C 1/00214* (2013.01); *B81C 1/00873* (2013.01); *B81C 3/005* (2013.01); *G02B 7/1821* (2013.01); *G02B 26/0833* (2013.01); *G02B 26/105* (2013.01); *H05K 1/189* (2013.01); *H05K 3/328* (2013.01); *B81B 2201/042* (2013.01); *B81B 2207/098* (2013.01); *B81C 2203/054* (2013.01); *B81C 2203/057* (2013.01); *H01L 2224/48091* (2013.01); *H01L 2924/1461* (2013.01);
(Continued)

(58) Field of Classification Search
CPC .... B81C 3/005; G02B 26/085; G02B 7/1821; G02B 26/105; G02B 26/0833; H01L 2924/002; H01L 2924/1461
USPC .......... 359/199.3, 212.1–214.1, 223.1–226.1
See application file for complete search history.

(56) References Cited

U.S. PATENT DOCUMENTS 9,057,936 B2 * 6/2015 Grabmaier ............. G03B 21/14
2002/0056560 A1    5/2002 Liu et al.
(Continued)

FOREIGN PATENT DOCUMENTS

EP    1207416 A1    5/2002
EP    1536267 A1    6/2005

*Primary Examiner* — Euncha Cherry

(57) ABSTRACT

A MEMS micro-mirror assembly (250, 300, 270, 400) comprising, a MEMS device (240) which comprises a MEMS die (241) and a magnet (231); a flexible PCB board (205) to which the MEMS device (240) is mechanically, and electrically, connected; wherein the flexible PCB board (205) further comprises a first extension portion (205b) which comprises a least one electrical contact (259a,b) which is useable to electrically connect the MEMS micro-mirro rassembly (250, 300, 270, 400) to another electrical component). There is further provided a projection system comprising such a MEMS micro-mirror assembly (250, 300, 270, 400).

20 Claims, 9 Drawing Sheets

(51) Int. Cl.
*H05K 1/18* (2006.01)
*H05K 3/32* (2006.01)
*B81C 1/00* (2006.01)
*G02B 7/182* (2006.01)
*G02B 26/10* (2006.01)
*H05K 1/11* (2006.01)

(52) U.S. Cl.
CPC .......... *H05K1/118* (2013.01); *H05K 2201/083* (2013.01); *H05K 2201/10083* (2013.01); *H05K 2203/049* (2013.01); *Y10T 29/4913* (2015.01)

(56) References Cited

U.S. PATENT DOCUMENTS

| | | |
|---|---|---|
| 2006/0261457 A1 | 11/2006 | Rancuret et al. |
| 2008/0084530 A1 | 4/2008 | Hirabayashi et al. |
| 2010/0075466 A1 | 3/2010 | Chew et al. |
| 2010/0165581 A1 | 7/2010 | Ziglioli et al. |
| 2011/0285972 A1 | 11/2011 | Hu et al. |

* cited by examiner

MEMS MICRO-MIRROR ASSEMBLY

FIELD OF THE INVENTION

The present invention concerns a MEMS micro-mirror assembly; and in particular, but not exclusively, to a MEMS micro-mirror assembly which comprises a MEMS micro-mirror device mounted on a flexible PCB board.

DESCRIPTION OF RELATED ART

A MEMS micro-mirror device is a device that contains an optical MEMS (Micro-Electrical-Mechanical-System). The optical MEMS may comprise an elliptical, cylindrical, rectangular, square or random shape micro-mirror that is adapted to move and to deflect light over time. The micro-mirror is connected by torsional arms to a fixed part and can tilt and oscillate along one or two axis. For example it can oscillate vertically and horizontally. Different actuation principles can be used, including electrostatic, thermal, electro-magnetic or piezo-electric. MEMS micro-mirror devices are known in which the area of these micro-mirrors are around a few mm². In this case, the dimensions of the MEMS micro-mirror device, comprising the packaging, is around ten mm². This MEMS micro-mirror device is usually made of silicon, and can be encapsulated in a package that can include the driving actuation electronics. Various optical components, such as for example lenses, beam combiner, quarter-wave plates, beam splitter and laser chips, are assembled with the packaged MEMS to build a complete system.

A typical application of the MEMS micro-mirror devices is for optical scanning and projection systems. In a projection system, a 2-D or 3-D image or video can be displayed on any type of projection surface. In a colour system, each pixel of the image is generated by combining modulated red, green and blue laser light, by means of, for example, a beam combiner, to generate a combined light beam which defines a pixel of the image or video. The MEMS micro-mirror in the MEMS micro-mirror device directs the combined light beam to a projection surface where the pixel of the image or video is displayed. Successive pixels of the image or video are display in this manner. By means of its oscillations, the MEMS micro-mirror within the MEMS micro-mirror device will continuously scan the combined light beam from left to right, right to left and from top to bottom (or according to a different trajectory including e.g. Lissajou or raster trajectories) so that all the pixels of the image, or video, are displayed on the projection surface, successively, pixel-by-pixel. The MEMS micro-mirror will oscillate about its oscillation axes at a frequency which ensures that the combined light beam is scanned across the projection surface at such a speed that a complete image is visible to a person viewing.

Typically, the MEMS micro-mirror in a MEMS micro-mirror device is able to oscillate along a single oscillation axis. Therefore, in order to display a 2-D image on a screen a projection system will require two MEMS micro-mirror devices; a first MEMS micro-mirror device which is required to scan the combined light beam along the horizontal and a second MEMS micro-mirror device which is required to scan the combined light beam along the along the vertical. Alternatively the MEMS micro-mirror in a MEMS micro-mirror device could be configured such that it can be oscillated about two orthogonal oscillation axes.

Referring now to FIGS. 5a and 5b which show a known MEMS micro-mirror device 1. FIG. 5a provides a top view of the MEMS micro-mirror device 1 and FIG. 5b shows a cross sectional view of the MEMS micro-mirror device 1, taken along A-A' of FIG. 5a.

The MEMS micro-mirror device 1 comprises a first support frame 2. A first torsional arm 3a and second torsional arm 3b connect a moveable part 4 to the support frame 2. The moveable part 4 comprises a micro-mirror 8 mounted thereon. In this embodiment the support frame 2 is fixed (i.e. immovable). The first and second torsional arms 3a,b define a first oscillation axis 7 for the moveable part 4. A first actuation coil 5 is supported on, and connected to, the moveable part 4. The first actuation coil 5 is arranged to extend, from a first electrical contact 9a which is located on the support frame 2, along the first torsional arm 3a, around the perimeter of the moveable part 4 and back along the first torsional arm 3a to a second electrical contact 9b which is located on the support frame 2.

The first support frame 2, first and second torsional arms 3a,b, the moveable part 4, the micro-mirror 8, and first actuation coil 5, define collectively a MEMS die 10. As shown in FIG. 5b the MEMS die 10 is mounted on, and fixed to (using glue for example), a magnet 6 such the first actuation coil 5 is submerged in the magnetic field 'B' generated by the magnet 6. Preferably the MEMS die 10 is fixed at the first support frame 2 to the magnet 6; this is usually achieved by providing glue between the first support frame 2 of the MEMS die 10 and the magnet 6.

During use, an electric current 'I' is passed through the first actuation coil 5. As the first actuation coil 5 is submerged in the magnetic field 'B' created by the magnet 6, the actuation coil 5 will provide a Laplace force which will be applied to the moveable part 4. The Laplace force will cause the moveable part 4, and thus the MEMS micro-mirror 8, to oscillate about its first oscillation axis 7.

It should be understood that the MEMS micro-mirror device 1 could alternatively be configured to enable oscillation of the moveable part 4 about two orthogonal axes, so that the MEMS micro-mirror 8 can scan light in two dimensions (typically along the horizontal and vertical). FIG. 6 shows a MEMS micro-mirror device 100 which is configured to enable oscillation of the moveable part 4 about two orthogonal axes.

The MEMS micro-mirror device 20 has many of the same features of the MEMS micro-mirror device 1 shown in FIGS. 5a and 5b; however in the MEMS micro-mirror device 20 the support frame 2 is configured to be moveable; the support frame 2 is configured such that it can oscillate about a second oscillation axis 17, which is orthogonal to the first oscillation axis 7.

The MEMS micro-mirror device 20 further comprises a fixed part 12 (i.e. an immovable part); the support frame 2 is connected to the fixed part 12 via third and fourth torsional arms 13a,b. The third and fourth torsional arms 13a,b, define the second oscillation axis 17. A second actuation coil 15 is connected to the support frame 2. This second actuation coil 15 will also be submerged by the magnetic field 'B' generated by the magnet 6.

A second actuation coil 15 is supported on, and connected to, the support frame 2. The second actuation coil 15 is arranged to extend, from a first electrical contact 19a which is located on the fixed part 12, along the third torsional arm 13a, around the perimeter of the support frame 2 and back along the third torsional arm 13a to a second electrical contact 19b which is located on the fixed part 12. It should be noted that the second actuation coil 15 does not extend along the fourth torsional arm 13b.

Furthermore, in the MEMS micro-mirror device 20 the first and second electrical contacts 9a, 9b for the first actuation coil 5 are located on the fixed part 12 and thus the first actuation coil 5 is arranged to also extend along the support frame 2 and the third and fourth torsional arms in order to electrically connect to the first and second electrical contacts 9a, 9b.

The first support frame 2, first and second torsional arms 3a,b, the moveable part 4, the micro-mirror 8, and first actuation coil 5, the fixed part 12, second actuation coil 15, third and fourth torsional arms 13a,b, define collectively a MEMS die 90. The MEMS die 90 is mounted on, and fixed to (using glue for example), a magnet 6 such the first actuation coil 5 is submerged in the magnetic field 'B' generated by the magnet 6. Preferably the MEMS die 90 is secured at the fixed part 12 to the magnet 6; this is usually achieved by providing glue between the fixed part 12 of the MEMS die 90 and the magnet 6.

During use an electric current 'i' is passed through the first actuation coil 5 which is connected to the moveable part 4. As the first actuation coil 5 is submerged in the magnetic field 'B' created by the magnet 6 the first actuation coil 5 will provide a Laplace force which will be applied to the moveable part 4. The Laplace force will cause the moveable part 4, and thus the micro-mirror 8, to oscillate about the first oscillation axis 7. An electric current 'I' is also passed through the second actuation coil 15 which is connected to the support frame 2. As the second actuation coil 15 is also submerged in the magnetic field 'B' created by the magnet 6, the second actuation coil 15 will provide a Laplace force which will be applied to the support frame 2. The Laplace force which is applied to the support frame 2 by the second actuation coil 15 will cause the support frame 2, and thus the moveable part 4 which is connected to the support frame 2 via the torsional arms 13a,b, to oscillate about the second oscillation axis 17. Accordingly the MEMS micro-mirror 8 will be oscillated about the first and second orthogonal oscillation axes 7,17. If the micro-mirror 8 reflects light as it is oscillating about the first and second orthogonal oscillation axes 7,17 the reflected light will be scanned in two dimensions e.g. horizontal and vertical. This will, for example, enable combined light beams which the micro-mirror 8 receives, to be scanned across the area of a projection screen in, for example, a zig-zag or raster pattern.

To integrate the MEMS micro-mirror devices 1,20 into an projection system (or other system), the MEMS micro-mirror device 1,20 is first mounted on a rigid PCB board and electrically connected to the rigid PCB board using wire bonds, to form a MEMS micro-mirror assembly. The MEMS micro-mirror assembly is then electrically connected to the projection system (or other system) using wire bonds or other electrical connectors, so that the MEMS micro-mirror assembly is integrated in the projection system (or other system). Disadvantageously, additional wire bonds or other electrical connectors are required to integrate the MEMS micro-mirror assembly into the projection system. Furthermore these wire bonds, or electrical connectors, are typically fragile and can easily break during handling, thus making it difficult to successfully integrate the MEMS micro-mirror assembly into the projection system (or other system).

It is an aim of the present invention to obviate or mitigate at least some of the above-mentioned disadvantages.

BRIEF SUMMARY OF THE INVENTION

According to the present invention there is provided a MEMS micro-mirror assembly comprising, a MEMS device which comprises a MEMS die and a magnet; a flexible PCB board to which the MEMS device is mechanically, and electrically, connected; wherein the flexible PCB board further comprises a first extension portion which comprises a least one electrical contact which is useable to electrically connect the MEMS micro-mirror assembly to another electrical component.

The MEMS die may have some or all of the features of the MEMS die of the MEMS devices shown in FIGS. 5a,b and 6.

The MEMS device may be mounted on the flexible PCB board.

The flexible PCB board may be interposed between the MEMS die and magnet. In this case the MEMS die and magnet may be mounted on opposing surfaces of the flexible PCB board.

The MEMS device may be mechanically connected to the flexible PCB board by means of glue. The glue may comprise epoxy glue, silicon glue, cyano-acrylate. Advantageously such glues can be cured for improving the adhesion.

The first extension portion may further comprise a least one electrical contact to which the MEMS device is electrically connected. The first extension portion comprises a plurality of electrical contacts to which the MEMS device is electrically connected The flexible PCB board further may further comprise a second extension portion which comprises a least one electrical contact to which the MEMS device is electrically connected. The second extension portion comprises a plurality of electrical contacts to which the MEMS device is electrically connected. Preferably the MEMS device is electrically connected to one or more electrical contacts which are provided on second extension portion only.

The MEMS device may comprise at least one electrical contact. The at least one electrical contact may be provided on the MEMS die. The MEMS device may comprise a plurality of electrical contacts. The at least one electrical contact may be used to electrically connect the MEMS device to the flexible PCB board.

The MEMS micro-mirror assembly may further comprise one or more wire bonds which electrically connect an electrical contact on the MEMS device to an electrical contact on the first extension portion, so that the MEMS device is electrically connected to the flexible PCB board.

The MEMS micro-mirror assembly may further comprise one or more wire bonds which electrically connect the electrical contact on the MEMS device to an electrical contact on the second extension portion, so that the MEMS device is electrically connected to the flexible PCB board.

The MEMS micro-mirror assembly may comprise a plurality of wire bonds. The MEMS micro-mirror assembly may comprise a plurality of wire bonds which electrically connect an electrical contact on the MEMS device to an electrical contact on the first and/or second extension portion of the flexible PCB board, so that the MEMS device is electrically connected to the flexible PCB board. Preferably a plurality of wire bonds will electrically connect each of a plurality of electrical contacts on the MEMS device to each of a plurality of electrical contacts on the first and/or second extension portion of the flexible PCB board, so that the MEMS device is electrically connected to the flexible PCB board. Using multiple wire bonds to electrically connect each of the electrical contacts will advantageously increase the mechanical stability of the assembly.

The electrical connection between each of the electrical contacts on the mirror and the electrical contacts on the flexible PCB board may be made using conductive glue which is provided between the electrical contact and wire bond. The electrical connection between each of the electrical contacts and the wire bonds may be glop-top, thick glue, epoxy or resist.

The MEMS micro-mirror assembly may further comprise protective material which is arranged to form an enclosure which encloses the wire bonds.

The flexible PCB board may comprise a PCB foil.

One or more electronic components are mounted on the flexible PCB board, in addition to the MEMS micro-mirror assembly. The one or more electronic components may comprise, electrical connectors, photodiode, active or passive electronic components for example.

The flexible PCB board may further comprise alignment marks to facilitate positioning the MEMS device on the flexible PCB board. The alignment marks may also facilitate the alignment of the MEMS die on the magnet. Alignment marks can be made using any suitable means e.g. by screen printing, by a photolithography process or laser writing.

The flexible PCB board may comprise one or more areas which are mechanically re-enforced. In the one or more areas which are mechanically re-enforced the flexible PCB board may be configured to be thicker than the other areas of the flexible PCB board, thereby providing for increased mechanical strength in these one or more areas. The areas which are mechanically re-enforced will have a higher mechanical strength. For example the flexible PCB board may be re-enforced in the regions of the wire bonds only, so as to prevent mechanical stresses, which are applied to the flexible PCB board, from detaching the wire bonds from electrical contacts.

The flexible PCB board may comprise conductive lines which electrically connect the electrical contacts which are on the flexible PCB board. For example the conductive lines may electrically connect electrical contacts, to which the MEMS device is electrically connected, to said electrical contacts which are useable to electrically connect the MEMS micro-mirror assembly to another electrical component. The flexible PCB board may be mechanically reinforced in the regions adjacent to conductive lines.

The flexible PCB board may be dimensioned such that edge the PCB board are aligned with edges of the MEMS device. Preferably, the flexible PCB board is dimensioned such that three edges of the PCB board are aligned with three edges of the MEMS device. Most preferably, the flexible PCB board is dimensioned such that two edges of the PCB board are aligned with two edges of the MEMS device. This will provide for a compact assembly.

The or each electrical contact on the MEMS device and/or the or each electrical contact on the first and/or second extension portion of the flexible PCB board may comprise Anisotrope Conductive Film (ACF).

Each of the contacts which comprise Anisotrope Conductive Film (ACF) may each further comprise a metal part.

The electrical contacts on the MEMS device may directly contact the electrical contacts on the flexible PCB board to electrically connect the MEMS device and flexible PCB board. The electrical contacts on the MEMS device may connect directly to the electrical contacts on the flexible PCB board so that the MEMS device is electrically and mechanically connected to the flexible PCB board. For example the electrical contacts on the MEMS device may be mounted on the electrical contacts on the flexible PCB board so that the MEMS device is electrically and mechanically connected to the flexible PCB board. The electrical contact on the flexible PCB board may bind to an electrical contact on the MEMS device to electrically and mechanically connect the flexible PCB board to the MEMS device. The electrical contacts on the MEMS device are soldered to the electrical contacts provided on the first and/or second extension portions of the flexible PCB board. This will cause the electrical contacts to bind together thus mechanically and electrically connecting the MEMS device and flexible PCB board.

The flexible PCB board may be arranged such that an electrical contact on the flexible PCB board abuts an electrical contact on the MEMS device, so that the MEMS device is electrically connected to the flexible PCB board.

According to a further aspect of the present invention there is provided a projection system comprising any one of the above mentioned MEMS micro-mirror assemblies.

BRIEF DESCRIPTION OF THE DRAWINGS

The invention will be better understood with the aid of the description of an embodiment given by way of example only and illustrated by the figures, in which:

FIG. 5b provides a cross sectional view of the MEMS micro-mirror device shown in FIG. 5a, taken along line A-A' of FIG. 5a;

DETAILED DESCRIPTION OF THE DRAWINGS

Figure 1A:
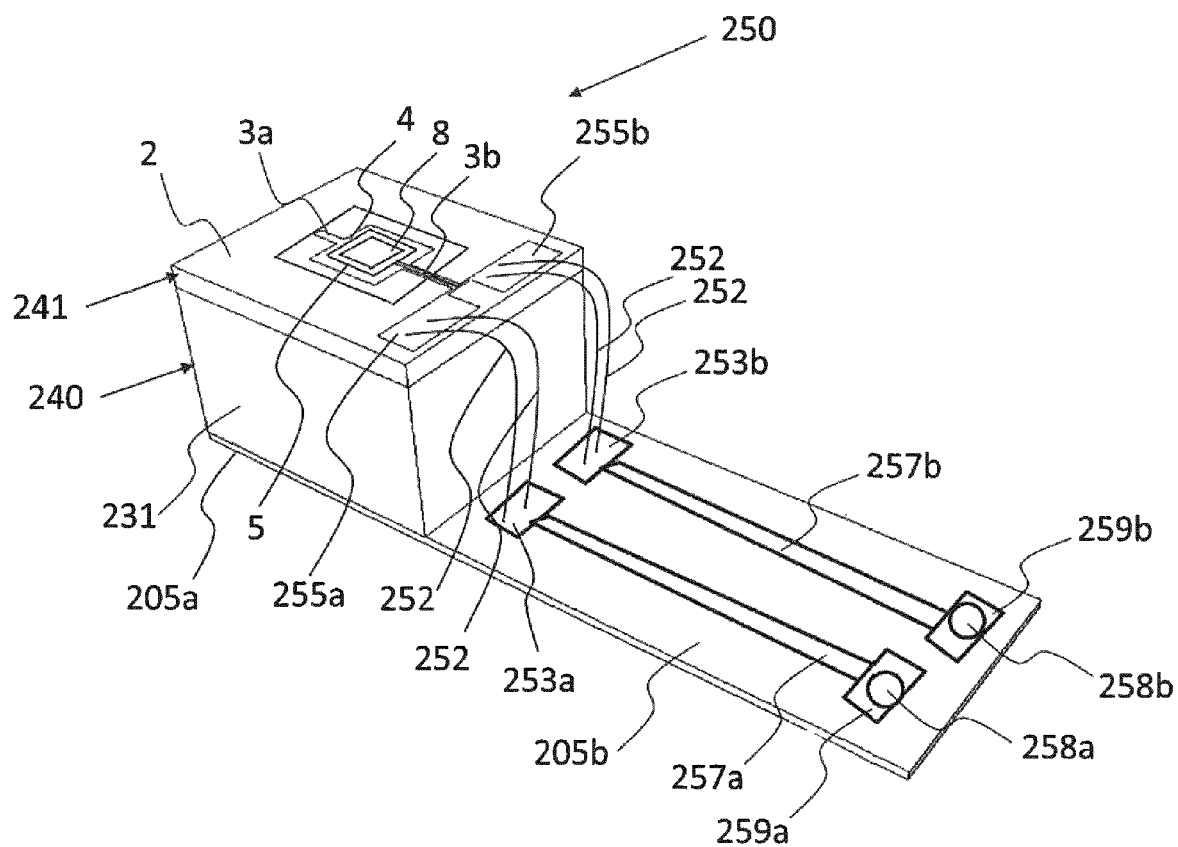
FIGS. 1a and b provide perspective views of a MEMS micro-mirror assembly according to a first embodiment of the present invention.
Figure 1B:
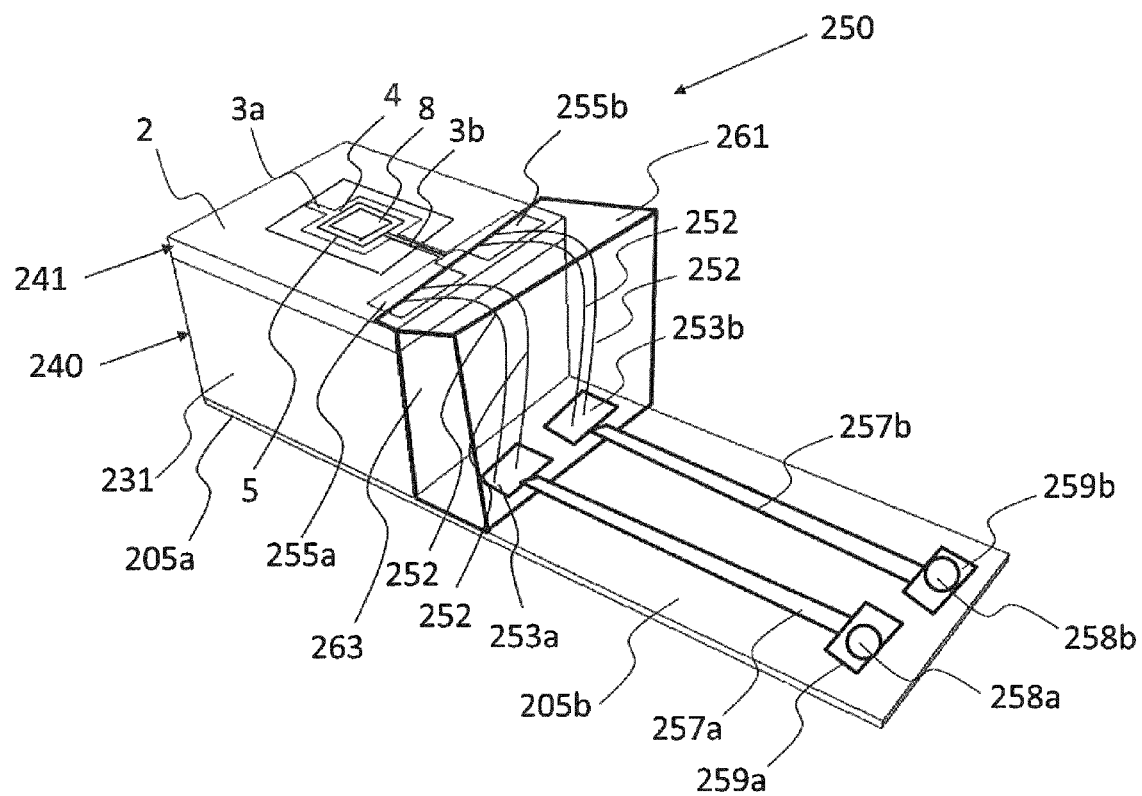
FIG. 1c provides a perspective view illustrating how the MEMS micro-mirror assembly of FIGS. 1a and 1b can be integrated into a projection device.

FIGS. 1a and 1b provide perspective views of a MEMS micro-mirror assembly 250 according to a first embodiment of the present invention. The MEMS micro-mirror assembly 250 comprises a MEMS device 240 mounted on a flexible PCB board 205.

The MEMS device 240 comprises a MEMS die 241 and a magnet 231. The MEMS device 240 is mechanically connected to the flexible PCB board 205 by means of glue which is provided between the magnet 231 and the flexible PCB board 205. It will be understood that the MEMS device 240 may be mechanically connected to the flexible PCB board 205 using any suitable means.

The MEMS die 241 may comprise any of the features of the MEMS die 10,90 of the MEMS devices 1,20 mentioned in the introduction. In this example, the MEMS die 241 comprises a first support frame 2, first and second torsional arms 3a,b, a moveable part 4, a MEMS micro-mirror 8, and a first actuation coil 5. In particular it should be noted that in this embodiment the moveable part 4 is magnetically actuated in the same manner as described for MEMS devices 1,20. The MEMS die 241 further comprises two electrical contacts 255a,b which can be used to electrically connect the MEMS device 240 to the flexible PCB board 205.

The flexible PCB board 205 comprises a portion 205a on which the MEMS device 240 is mounted and a first extension portion 205b.

The first extension portion 205b comprises two electrical contacts 253a,b. In this example a plurality of wire bonds 252 electrically connect each of the two electrical contacts 253a,b on the first extension portion 205b of flexible PCB board 205, to the two electrical contacts 255a,b provided on the MEMS device 240, so as to electrically connect the MEMS device 240 to the flexible PCB board 205. Specifically, in this example two wire bonds 252 electrically connect each electrical contact 253a,b on the first extension portion 205b of the flexible PCB board 205 to each electrical contact 255a,b on the MEMS device 240. It will be understood that any number of electrical contacts may be provided on the first extension portion 205b of the flexible PCB board 205 or MEMS device 240 and any number of wire bonds 252 may be used to establish electrical connection between said contacts; using two or more wire bonds 252 to establish electrical connection will provide a more robust electrical connection because if one of the wire bonds 252 should break, the MEMS device 240 will still be electrically connected to the flexible PCB board 205 by means of the other, unbroken, wire bonds 252.

As shown in FIG. 1b the MEMS micro-mirror assembly 250 may optionally comprise a protective material 261 which is arranged to form an enclosure 263 which encloses the plurality of wire bonds 252. The protective material 261 protects the wire bonds 252 from mechanical tearing and or shearing and from dust and humidity.

The first extension portion 205b of the flexible PCB board 205 further comprises two electrical contacts 259a,b which are useable to electrically connect the MEMS micro-mirror assembly 250 to another electrical component. For example, if the MEMS micro-mirror assembly 250 is to be integrated into a projection device, the electrical contacts 259a,b can be used to electrically connect the MEMS micro-mirror assembly 250 to the appropriate electrical contacts provided in the projection device so that the MEMS micro-mirror assembly 250 becomes integrated in the projection device. In this example the electrical contacts 259a,b further comprise metalized vias 258a,b. In this case, a metalized via can be used to electrically connect the top of the flexible PCB to the top of another PCB placed underneath, the electrical connect is then done by providing metal in the vias, that by capillarity will, connect all the pads of both PCB (the flex PCB and the other PCB).

The flexible PCB board 205 further comprises conductive lines 257a,b, which are arranged to electrically connect the electrical contacts 253a,b to the electrical contacts 259a,b.

Figure 1C:
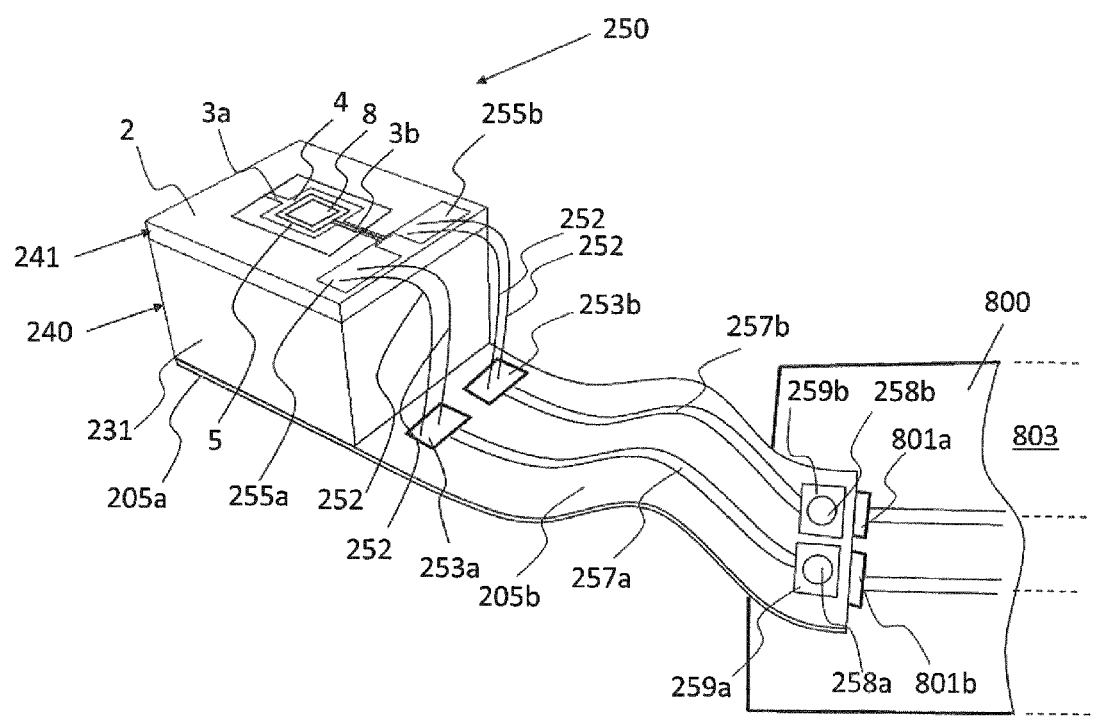

FIG. 1c illustrates how the MEMS micro-mirror assembly 250 can be integrated into a projection device 803 (or any other device or system). The first extension portion 205b of the flexible PCB board 205 is flexed so that the electrical contacts 259a,b of the MEMS micro-mirror assembly 250 abut with, or attach to, electrical contacts 801a,b provided on a part 800 of the projection device 803. The MEMS micro-mirror assembly 250 is thus electrically connected to the electrical contacts 801a,b provided on the part 800 of the projection device and is integrated into the projection device 803.

Advantageously, since the PCB board 205 is a flexible PCB board 205 it may be flexed to allow the electrical contacts 259a,b to directly contact the electrical contacts 801a,b provided on the part 800 of the projection device 803. Thus, the use of a flexible PCB board 205 obviates the need for fragile wire bonds 252 to electrically connect the MEMS micro-mirror assembly 250 to the appropriate electrical contacts 801a,b provided in the projection device 803. Accordingly, the MEMS micro-mirror assembly 250 of the present invention enables easier and more robust integration into a projection device 803 (or other device or system).

Figure 2A:
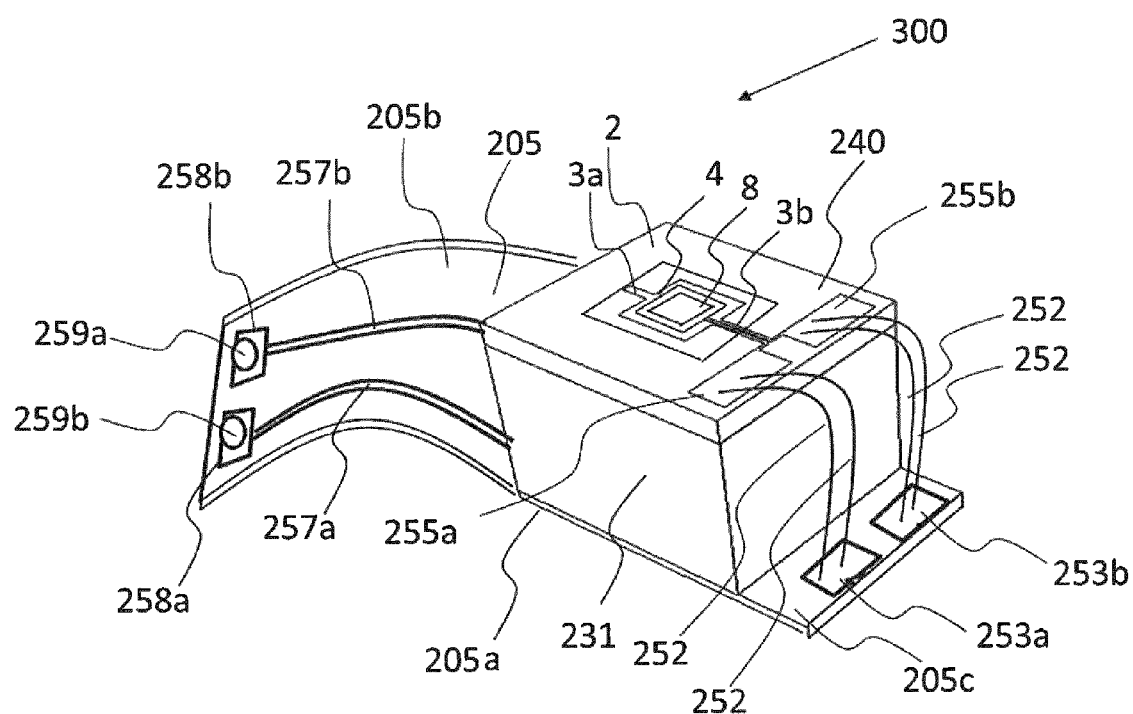
FIG. 2a provides a perspective view of a MEMS micro-mirror assembly according to a further embodiment of the present invention.

Disadvantageously, flexing the first extension portion 205b of the flexible PCB board 205 may induce stress on the wire bonds 252. Accordingly, as the first extension portion 205b of the flexible PCB board 205 is flexed so that the electrical contacts 259a,b directly contact the electrical contacts 801a,b provided on the part 800 of the projection device 803, the wire bonds 252, which electrically connect the MEMS device 240 to the flexible PCB board 205, may break. FIG. 2a provides a perspective view of a MEMS micro-mirror assembly 300 according to another embodiment of the present invention, which addresses this problem.

The MEMS micro-mirror assembly 300 shown in FIG. 2a has many of the same features as the MEMS micro-mirror assembly 250 shown in FIG. 1 and like features are awarded the same reference numbers.

The first extension portion 205b comprises two electrical contacts 259a,b which are useable to electrically connect the MEMS micro-mirror assembly 300 to another electrical component.

The flexible PCB board 205 of the MEMS micro-mirror assembly 300 further comprises a second extension portion 205c which comprises two electrical contacts 253a,b to which the MEMS device 240 is electrically connected. Importantly, unlike the MEMS micro-mirror assembly 250 shown in FIGS. 1a and 1b, the two electrical contacts 253a,b on the flexible PCB board 205 to which the MEMS device 240 is electrically connect are not provided on the first extension portion 205b, rather they are provided on the second extension portion 205c.

A plurality of wire bonds 252 electrically connect the two electrical contacts 253a,b provided on the second extension portion 205c of the flexible PCB board 205 to the two electrical contacts 255a,b provided on the MEMS device 240, so as to electrically connect the MEMS device 240 to the flexible PCB board 205. In this example two wire bonds 252 electrically connect each electrical contact 253a,b on the second extension portion 205c of the flexible PCB board 205, to each electrical contact 255a,b on the MEMS device 240. However, it will be understood that any number of electrical contacts may be provided on the second extension portion 205c of the flexible PCB board 205 or MEMS device 240, and any number of wire bonds 252 may be used to establish electrical connection between said contacts. Using two or more wire bonds 252 will provide a more robust electrical connection because if one of the wire bonds 252 should break, the MEMS device 240 will still be electrically connected to the flexible PCB board 205 by means of the other, unbroken, wire bonds 252

Since, in the MEMS micro-mirror assembly 300, the MEMS device 240 is electrically connected to the flexible PCB board 205 by means of wire bonds 252 which connect to electrical contacts 253a,b provided on the second extension portion 205c of the flexible PCB board 205, little or no stress is induced in the wire bonds 252 when the first extension portion 205b of the flexible PCB board 205 is flexed. Accordingly there is reduced risk of the wire bonds 252 breaking when the first extension portion 205b of the flexible PCB board 205 is flexed to integrate the MEMS micro-mirror assembly 300 into a projection device 803 (or other device or system).

Figure 2B:
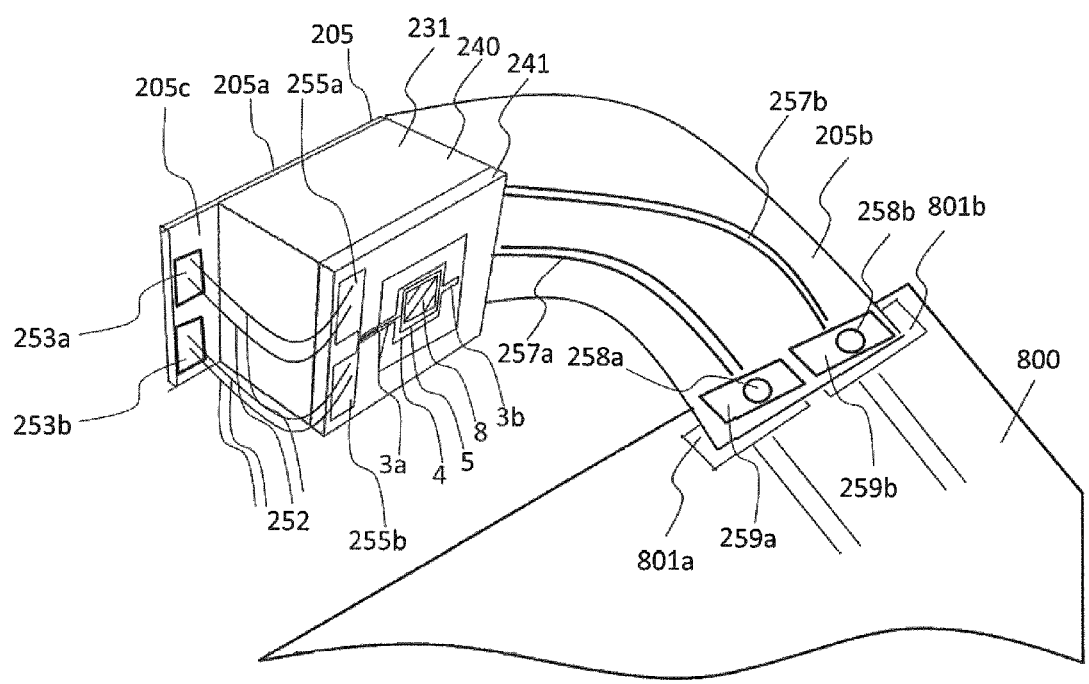
FIG. 2b provides a perspective view illustrating how the MEMS micro-mirror of FIG. 2a can be integrated into a projection device.

FIG. 2b illustrates how the MEMS micro-mirror assembly 300 can be integrated into a projection device 803 (or any other device or system), the electrical contacts 259a,b being used to electrically connect the MEMS micro-mirror assembly 300 to the electrical contacts 801a,b provided on the part 800 of the projection device 803.

The first extension portion 205b of the flexible PCB board 205 is flexed so that the electrical contacts 259a,b of the MEMS micro-mirror assembly 300 abut with, or attach to, electrical contacts 801a,b provided on a part 800 of the projection device 803. As the first extension portion 205b of the flexible PCB board 205 is flexed while the second extension portion 205c remains undistorted.

Advantageously, since the PCB board 205 is a flexible PCB board 205 the first extension portion 205b may be flexed so that the electrical contacts 259a,b directly contact the electrical contacts 801a,b provided on the part 800 of the projection device 803, so as to integrate the MEMS micro-mirror assembly 300 into the projection device 803. Thus, the use of a flexible PCB board 205 obviates the need for fragile wire bonds 252 to electrically connect the MEMS micro-mirror assembly 300 to the electrical contacts 801 a,b provided on the part 800 of the projection device 803. Accordingly, the MEMS micro-mirror assembly 300 enables easier and more robust integration into a projection device (or other device or system). Furthermore, as the MEMS device 240 is electrically connected to the flexible PCB board 205 by means of wire bonds 252 which connect to electrical contacts 253a,b provided on the second extension portion 205c of the flexible PCB board 205, little or no stress is induced in the wire bonds 252 when the first extension portion 205b of the flexible PCB board 205 is flexed so that the electrical contacts 259a,b directly contact the electrical contacts 801 a,b provided on the part 800 of the projection device 803. Accordingly there is a reduced risk of the wire bonds 252 breaking when the first extension portion 205b of the flexible PCB board 205 is flexed to integrate the MEMS micro-mirror assembly 300 into the projection device 803 (or other device or system).

Figure 3:
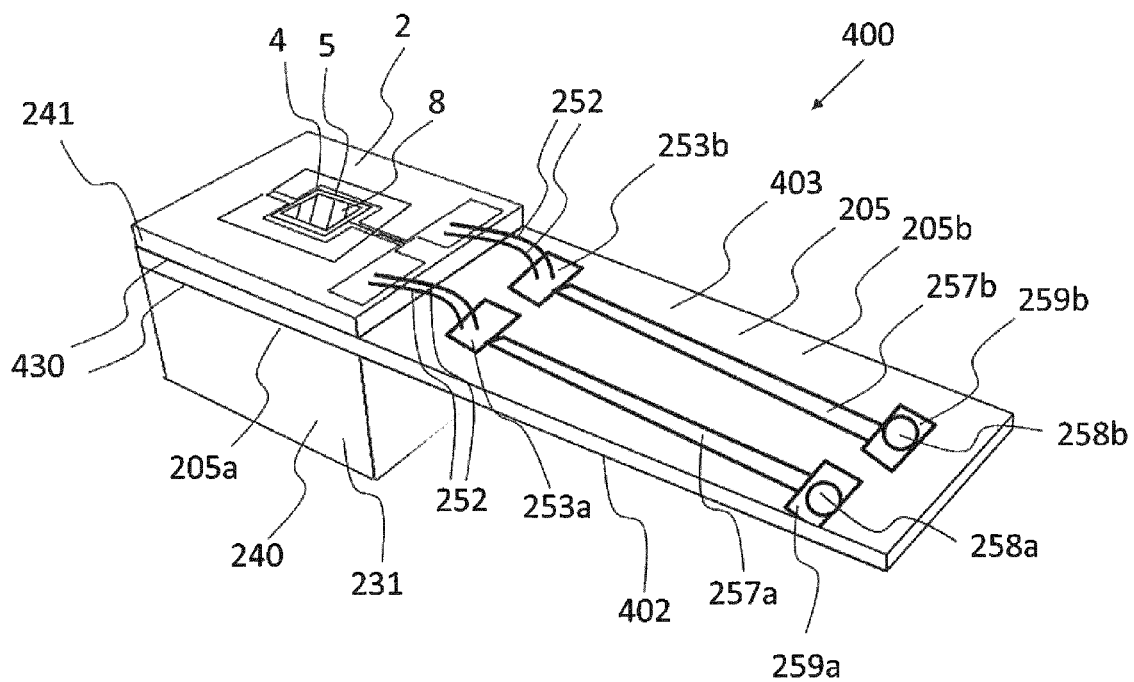
FIG. 3 provides a perspective view of a MEMS micro-mirror assembly according to a further embodiment of the present invention.

FIG. 3 provides a perspective view of a MEMS micro-mirror assembly 400 according to a further embodiment of the present invention. The MEMS micro-mirror assembly 400 shown in FIG. 3 has many of the same features as the MEMS micro-mirror assembly 250 shown in FIG. 1 and like features are awarded the same reference numbers.

In the MEMS micro-mirror assembly 400 the flexible PCB board 205 is interposed between the MEMS die 241 and a magnet 231. The MEMS device 240 is mechanically connected to the flexible PCB board 205 by means of glue 430 which is provided between the magnet 231 and a first surface 402 of the flexible PCB board 205 and between the MEMS die 241 and a second, opposite, surface 403 of the flexible PCB board 205. It will be understood that any suitable glue maybe used.

Advantageously, in the MEMS micro-mirror assembly 400, shorter wire bonds 252 are required to electrically connect the MEMS device 240 to the flexible PCB board 205.

Figure 4:
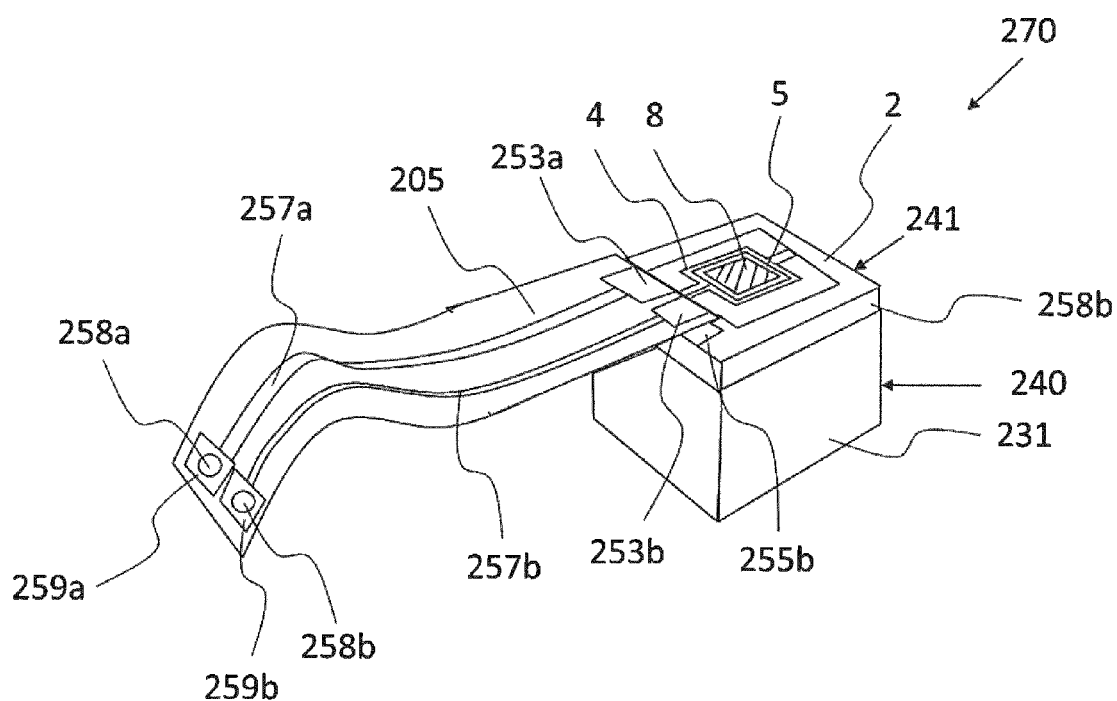
FIG. 4 provides a perspective view of a MEMS micro-mirror assembly according to a further embodiment of the present invention.
Figure 5A:
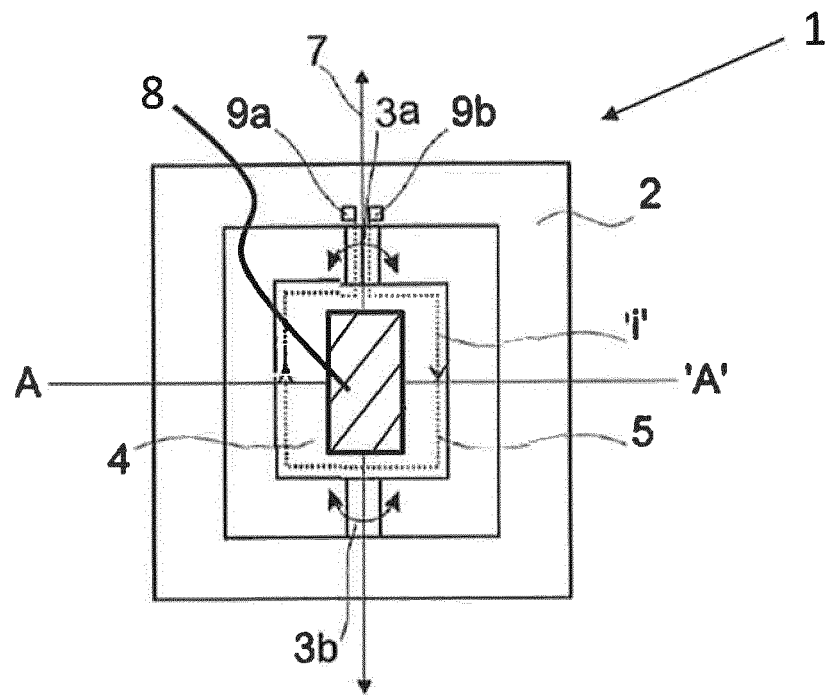
FIG. 5a provides a plan view of a known MEMS micro-mirror device.
Figure 5B:
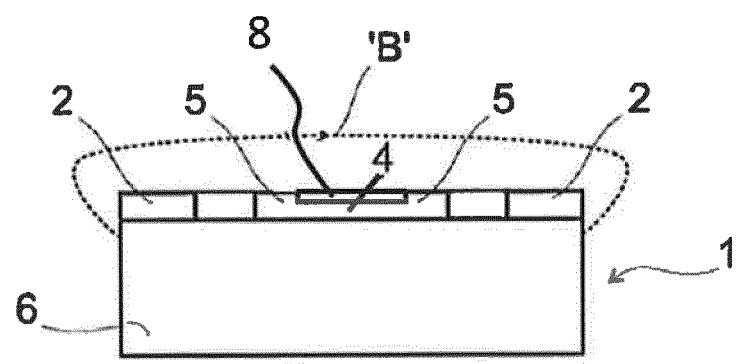
Figure 6:
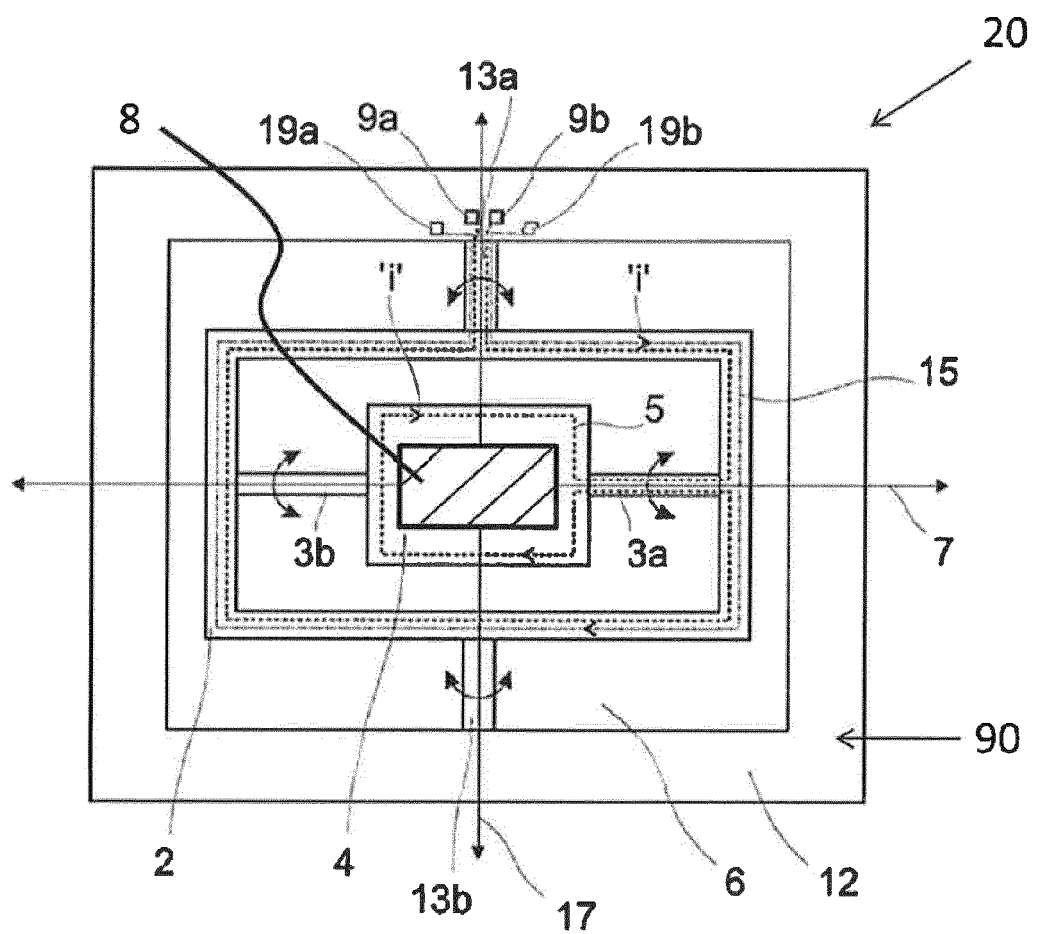
FIG. 6 provides a plan view of another known MEMS micro-mirror device.

FIG. 4 provides a perspective view of a MEMS micro-mirror assembly 270 according to a further embodiment of the present invention. The MEMS micro-mirror assembly 270 has many of the same features as the MEMS micro-mirror assembly 250 shown in FIGS. 1a and 1b and like features are awarded the same reference numbers.

In this embodiment the MEMS device is not mounted on the flexible PCB board. In the MEMS micro-mirror assembly 270 the electrical contacts 253a,b on the flexible PCB board 205 are not connected to the electrical contacts 255a,b on the MEMS device 240 by means of wire bonds 252; rather the flexible PCB board 205 is arranged so that the electrical contacts 253a,b on the flexible PCB board 205 are connected directly to the electrical contacts 255a,b on the MEMS device 240. Specifically, the electrical contacts 255a,b on the flexible PCB board 205 are soldered to the electrical contacts 253a,b on the MEMS device 240 so as to electrically and mechanically connected the MEMS device 240 to the flexible PCB board 205. The electrical contacts 255a,b 253a,b may each comprise Anisotrope Conductive Film (ACF)

It will be understood that in each of the above described embodiments, each of the electrical contacts 253a,b on the flexible PCB board 205 may be configured so that they are accessible from opposite sides of the flexible PCB board 205 (e.g. accessible at the first and second surfaces 402,403 of the flexible PCB board 205); for example the electrical contacts 253a,b may be provided in through holes which are defined in flexible PCB board 205, so that the electrical contacts 253a,b are accessible from opposite sides of the flexible PCB board 205. Alternatively the electrical contacts 253a,b may be wrapped around a side edge of the flexible PCB board 205 so that a portion of each electrical contact 253a,b extends along the opposite surfaces of the flexible PCB board 205 (e.g along the first and second surfaces 402,403 of the PCB board). Advantageously, electrical contact with the electrical contacts 253a,b can then be achieved from opposing sides of the flexible PCB board 205 e.g. at both first and second surfaces 402,403 of the flexible PCB board 205.

It will also be understood that any of the electrical contacts provided on the flexible PCB board or on the MEMS device may each comprise Anisotrope Conductive Film (ACF).

It should be understood that the flexible PCB boards 205, in each of the above mentioned embodiments, may be further mounted on a metallic plate; the MEMS device may be maintained attached to the metallic plate by means of the magnetic attraction force between the magnet and the metal plate, thereby obviating the need for glue,.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A MEMS micro-mirror assembly comprising;
   a MEMS device, which comprises a MEMS die and a magnet;
   a flexible PCB board to which the MEMS device is mechanically, and electrically, connected;
   wherein the flexible PCB board further comprises a first extension portion, which is defined by a portion of the flexible PCB board, which comprises a least one electrical contact, which is useable to electrically connect the MEMS micro-mirror assembly to another electrical component, wherein the MEMS device is mounted on the flexible PCB board.

2. A MEMS micro-mirror assembly according to claim 1, wherein the PCB board is interposed between the MEMS die and magnet.

3. A MEMS micro-mirror assembly according to claim 1, wherein the first extension portion further comprises a least one electrical contact to which the MEMS device is electrically connected.

4. A MEMS micro-mirror assembly according to claim 1, wherein the flexible PCB board further comprises a second extension portion which comprises a least one electrical contact to which the MEMS device is electrically connected.

5. A MEMS micro-mirror assembly according to claim 1, wherein the MEMS device comprises at least one electrical contact.

6. A MEMS micro-mirror assembly according to claim 1, wherein the electrical contacts on the PCB board are soldered directly to electrical contacts on the MEMS device, so as to electrically and mechanically connect the MEMS device to the flexible PCB board.

7. A MEMS micro-mirror assembly according to claim 5, wherein the MEMS micro-mirror assembly further comprise one or more wire bonds which electrically connect the electrical contact on the MEMS device to an electrical contact on the first extension portion, so that the MEMS device is electrically connected to the flexible PCB board.

8. A MEMS micro-mirror assembly according to claim 5, wherein the MEMS micro-mirror assembly further comprise one or more wire bonds which electrically connect the electrical contact on the MEMS device to an electrical contact on the second extension portion, so that the MEMS device is electrically connected to the flexible PCB board.

9. A MEMS micro-mirror assembly according to claim 5, wherein the MEMS micro-mirror assembly comprises a plurality of wire bonds which electrically connect an electrical contact on the MEMS device to an electrical contact on the first or second extension portion.

10. A MEMS micro-mirror assembly according claim 7, further comprising protective material which is arranged to form an enclosure which encloses the wire bonds.

11. A MEMS micro-mirror assembly according to claim 1, wherein the flexible PCB board further comprises alignment marks to facilitate positioning the MEMS device on the flexible PCB board.

12. A MEMS micro-mirror assembly according to claim 1, wherein the flexible PCB board further comprises one or more areas which are mechanically re-enforced.

13. A MEMS micro-mirror assembly according to claim 1, wherein the flexible PCB board is dimensioned such that two or three edges of the PCB board are aligned with two or three edges of the MEMS device.

14. A projection system comprising:
a light source; and
a micro-electromechanical system (MEMS) mirror assembly optically coupled to the light source, the MEMS mirror assembly to receive light from the light source and direct the light towards a projection surface, the MEMS mirror assembly comprising:
a MEMS device comprising a MEMS die and a magnet; and
a flexible printed circuit board (PCB) mechanically connected to the MEMS device, the flexible PCB comprising a first extension portion to electrically couple the MEMS device to at least one other electrical component.

15. A projection system according to claim 14, wherein the flexible PCB is interposed between the MEMS die and the magnet.

16. A projection system according to claim 14, wherein the flexible PCB comprises alignment marks to position the MEMS device on the flexible PCB.

17. A projection system according to claim 14, wherein the flexible PCB comprises one or more mechanically re-enforced areas.

18. A projection system according to claim 14, the flexible PCB having a first dimension and the MEMS device having a second dimension, wherein the first dimension and the second dimension are the same.

19. A projection system according to claim 14, the MEMS device comprising a first electrical contact and the first extension portion comprising a second electrical contact, the first electrical contact soldered to the second electrical contact.

20. A projection system according to claim 19, the MEMS mirror assembly comprising one or more wire bonds to electrically connect the first electrical contact to the second electrical contact.

* * * * *